US012772413B2

(12) United States Patent
Cader et al.

(10) Patent No.: US 12,772,413 B2
(45) Date of Patent: Oct. 20, 2026

(54) COMPUTING MODULES WITH HYBRID THERMAL MANAGEMENT

(71) Applicant: NVIDIA CORPORATION, Santa Clara, CA (US)

(72) Inventors: Tahir Cader, Spokane Valley, WA (US); David Copeland, Nederland, CO (US); Elad Mentovich, Tel Aviv (IL)

(73) Assignee: NVIDIA Corporation, Santa Clara, CA (US)

( * ) Notice: Subject to any disclaimer, the term of this patent is extended or adjusted under 35 U.S.C. 154(b) by 304 days.

(21) Appl. No.: 18/369,917

(22) Filed: Sep. 19, 2023

(65) Prior Publication Data

US 2025/0098108 A1 Mar. 20, 2025

(51) Int. Cl.
*H05K 7/20* (2006.01)
*G06F 1/20* (2006.01)

(52) U.S. Cl.
CPC ........... *H05K 7/20272* (2013.01); *G06F 1/20* (2013.01)

(58) Field of Classification Search
CPC .. H05K 7/20272; G06F 1/20; G06F 2200/201
See application file for complete search history.

(56) References Cited

U.S. PATENT DOCUMENTS 4,450,472 A * 5/1984 Tuckerman ........... F28D 15/046 257/713
5,349,831 A * 9/1994 Daikoku ............... H01L 23/427 165/80.4
6,986,382 B2 * 1/2006 Upadhya ............. F28D 15/0266 174/15.1

(Continued)

FOREIGN PATENT DOCUMENTS

CN 110662389 A * 1/2020 ........... H05K 7/2029

OTHER PUBLICATIONS

Zhou Tengfei; Chen Haiping; Wang Chao; Chi Shanjiu, "Heat dissipation device and electronic equipment", Jan. 7, 2020, Huawei Tech Co LTD., Entire Document (Translation of CN 110662389). (Year: 2020).*

(Continued)

*Primary Examiner* — Stephen S Sul
(74) *Attorney, Agent, or Firm* — Schwegman Lundberg & Woessner, P.A.

(57) ABSTRACT

Devices, apparatuses, systems, and methods are provided for hybrid thermal management in computing modules. An example computing module includes a first computing component having a first operating temperature and a second computing component having a second operating temperature. The first operating temperature is greater than the second operating temperature. The example computing module further includes a hybrid thermal management system including a cooling delivery device configured to receive a cooling fluid. The cooling delivery device defines a first section configured to dissipate heat generated by the first computing component and a second section configured to dissipate heat generated by the second computing component. The first section of the cooling delivery device may be fluidically isolated from the second section of the cooling delivery device or the second section may be in fluid communication with the first section.

20 Claims, 7 Drawing Sheets

(56) References Cited

U.S. PATENT DOCUMENTS

| | | | | |
|---|---|---|---|---|
| 2003/0151896 | A1* | 8/2003 | Zeighami | H01L 23/427 165/104.33 |
| 2005/0185378 | A1* | 8/2005 | Tilton | H05K 7/20345 361/699 |
| 2010/0328892 | A1* | 12/2010 | Madison, Jr. | B23P 15/26 165/185 |
| 2019/0364691 | A1* | 11/2019 | Subrahmanyam | H05K 7/20518 |
| 2022/0201896 | A1* | 6/2022 | Edmunds | H05K 7/20272 |
| 2022/0240417 | A1* | 7/2022 | Rider | H01L 23/4735 |
| 2022/0256684 | A1* | 8/2022 | Gao | H05K 7/20709 |
| 2023/0025167 | A1* | 1/2023 | Gao | H05K 7/20254 |
| 2023/0420338 | A1* | 12/2023 | Subrahmanyam | H01L 23/3672 |
| 2024/0196562 | A1* | 6/2024 | Gregory | H05K 7/20772 |
| 2024/0215205 | A1* | 6/2024 | Shahi | H05K 7/20272 |
| 2024/0260228 | A1* | 8/2024 | Chuang | H05K 7/20263 |
| 2025/0063700 | A1* | 2/2025 | Peterson | H05K 7/20772 |

OTHER PUBLICATIONS

Ruso et al., Pending U.S. Appl. No. 17/892,283, filed Aug. 22, 2022.
Ruso et al., Pending U.S. Appl. No. 17/968,447, filed Oct. 18, 2022.
Albright et al., Pending U.S. Appl. No. 18/377,017, filed Oct. 5, 2023.
Cader et al., Pending U.S. Appl. No. 18/118,958, filed Mar. 8, 2023.
Ganju et al., Pending U.S. Appl. No. 17/935,511, filed Sep. 26, 2022.
Chao et al, Pending U.S. Appl. No. 18/223,154, filed Jul. 18, 2023.

* cited by examiner

COMPUTING MODULES WITH HYBRID THERMAL MANAGEMENT

TECHNOLOGICAL FIELD

Example embodiments of the present disclosure relate generally to high-performance networking and computing systems and, more particularly, to computing modules with hybrid thermal management.

BACKGROUND

High-performance computing systems, such as those used in datacenters and other networking environments (e.g., datacom, telecom, and/or other similar data/communication transmission networks), may leverage numerous computing components (e.g., central processing units (CPUs), graphics processing unit (GPUs), high-bandwidth memories (HBMs), etc.) to perform the operations associated with these environments. During operation, the heat generated by these components may impact the overall operation of the computing systems, particularly as the operational capability of these components increases. Applicant has identified a number of deficiencies and problems associated with conventional heat dissipation techniques. Through applied effort, ingenuity, and innovation, many of these identified problems have been solved by developing solutions that are included in embodiments of the present disclosure, many examples of which are described in detail herein.

BRIEF SUMMARY

Devices, apparatuses, systems, and methods are provided for hybrid thermal management in networking computing modules. With reference to an example computing module, the example computing module may include a first computing component having a first operating temperature and a second computing component having a second operating temperature. The first operating temperature may be greater than the second operating temperature. The computing module may further include a hybrid thermal management system that includes a cooling delivery device configured to receive a cooling fluid. The cooling delivery device may define a first section configured to dissipate heat generated by the first computing component and a second section configured to dissipate heat generated by the second computing component.

In some embodiments, the second section may be in fluid communication with the first section.

In some further embodiments, the cooling fluid received by the cooling delivery device may be directed from the first section of the cooling delivery device to the second section of the cooling delivery device.

In some further embodiments, the second section of the cooling delivery device may be downstream of the first section of the cooling delivery device.

In some further embodiments, an inlet temperature of the cooling fluid when received by the first section of the cooling delivery device may be less than the first operating temperature of the first computing component. In such an embodiment, an exhaust temperature of the cooling fluid entering the second section of the cooling delivery device may greater than the inlet temperature of the cooling fluid but less than the second operating temperature of the second computing component.

In some further embodiments, the first section of the cooling delivery device may further include an inlet manifold configured to receive the cooling fluid. In such an embodiment, the inlet manifold may be in fluid communication with a cooling fluid source.

In some further embodiments, the first section of the cooling delivery device may further include an exhaust manifold configured to direct the cooling fluid from the first section of the cooling delivery device to the second section of the cooling delivery device.

In some embodiments, the first section of the cooling delivery device may further define one or more microfluidic channels that at least partially support the cooling fluid therein. In such an embodiment, the one or more microfluidic channels may be etched into a surface of a die of the first computing component.

In some further embodiments, the second section of the cooling delivery device may further define a cooling plate. In such an embodiment, the cooling plate may be configured to substantially seal the first computing component from incursion of the cooling fluid within the cooling delivery device.

In some embodiments, in operation, the first section of the cooling delivery device may be configured to receive the cooling fluid in a first direction and redirect the cooling fluid to a second direction that is substantially perpendicular with respect to the first direction. In such an embodiment, the first section of the cooling delivery device may be further configured to redirect the cooling fluid to a third direction opposite the first direction towards the second section of the cooling delivery device.

In some embodiments, in operation, the cooling fluid received by the cooling delivery device may impinge upon the first section of the cooling delivery device and may be directed laterally outward along a surface of the first section.

In some embodiments, the second computing component is positioned proximate a first side of the first computing component. In such an embodiment, the computing module may further include a third computing component disposed on a second side of the first computing component. The cooling delivery device may further include a third section in fluid communication with the first section and configured to dissipate heat generated by the third computing component.

In any embodiment, the first computing component may be a graphics processing unit (GPU) and the second computing component may be a high-bandwidth memory (HBM) device.

In other embodiments, the first section of the cooling delivery device may be fluidically isolated from the second section of the cooling delivery device.

The above summary is provided merely for purposes of summarizing some example embodiments to provide a basic understanding of some aspects of the present disclosure. Accordingly, it will be appreciated that the above-described embodiments are merely examples and should not be construed to narrow the scope or spirit of the disclosure in any way. It will be appreciated that the scope of the present disclosure encompasses many potential embodiments in addition to those here summarized, some of which will be further described below.

BRIEF DESCRIPTION OF THE DRAWINGS

Having described certain example embodiments of the present disclosure in general terms above, reference will now be made to the accompanying drawings. The components illustrated in the figures may or may not be present in certain embodiments described herein. Some embodiments may include fewer (or more) components than those shown in the figures.

DETAILED DESCRIPTION

Overview

Figure 1:
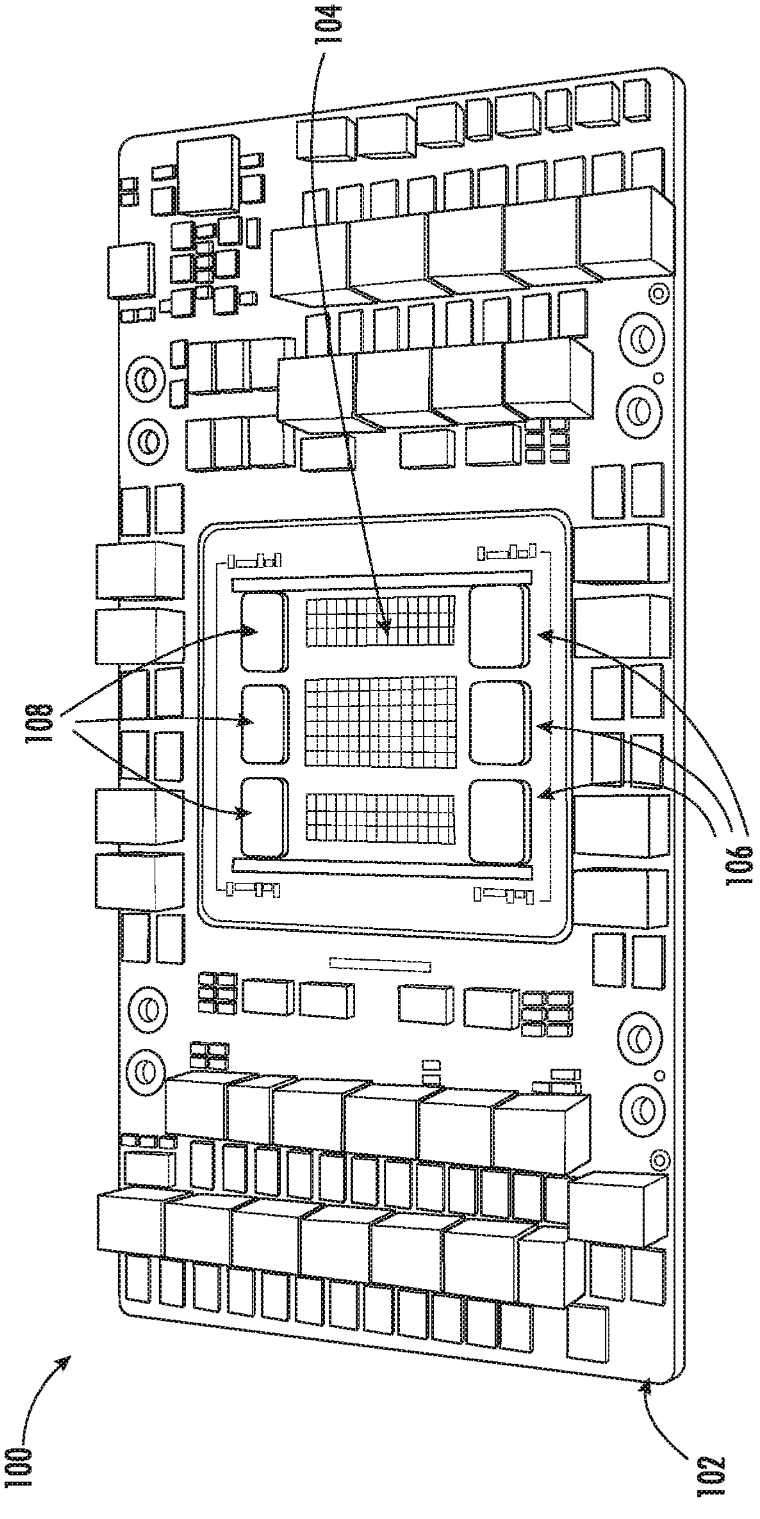
FIG. 1 illustrates an example computing module supporting computing components in accordance with some embodiments described herein.

Embodiments of the present disclosure now will be described more fully hereinafter with reference to the accompanying drawings in which some but not all embodiments are shown. Indeed, the present disclosure may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As described above, datacenters and other networking environments (e.g., datacom, telecom, and/or other similar data/communication transmission networks), may leverage numerous electronic or computing components (e.g., CPUs, GPUS, HBMs, voltage regulators (VRs) etc.) to perform the operations associated with these environments. During operation, the heat generated by these components may impact the overall operation or performance of the computing modules and computing systems that employ the computing modules. The thermal burden of some of these components may be further increased in high performance/power computing systems, such as high-power GPU systems, with rapidly increasing power consumption levels for not only the primary computing components (e.g., GPUs, CPUs, etc.) but also for the circuit boards and related secondary components (e.g., HBM, VRs, etc.) that support the operations of these primary computing components. Given that the power density associated with these computing components varies, the thermal burden associated with particular computing components may similarly vary. Conventional methods for dissipating heat or otherwise reducing the thermal burden of these computing modules and systems, however, often fail to account for this variability in power density.

By way of example, conventional systems typically rely upon air-based cooling techniques that are generically supplied to computing modules without consideration for the particular computing components (e.g., number, amount, positioning, etc. of the computing components) leveraged by the computing module. This singular thermal management approach often fails to effectively dissipate heat for primary computing components (e.g., those components having a relatively higher thermal burden) by leveraging cooling systems designed for the thermal burden of the secondary computing components (e.g., those components having a relatively lower thermal burden). Alternatively, these systems may be cost prohibitive when leveraging cooling systems designed for the thermal burden of the primary computing components as opposed to the secondary computing components. Said differently, the excessive heat dissipation offered by these cooling techniques is not effectively used by the secondary computing components or is otherwise unnecessary (e.g., the thermal burden of these components does not warrant the heat dissipation offered by these systems).

In order to address these issues and others, the embodiments of the present disclosure may leverage a hybrid thermal management system that uses cooling delivery sections that are computing component specific. For example, the hybrid thermal management systems described herein may include a first section of the cooling delivery device (e.g., microfluidic channels or the like) that is configured to dissipate heat generated by a first computing component that has a relatively higher thermal burden (e.g., a CPU, GPU, etc.). For the example second computing components having a relatively lower thermal burden (e.g., HBMs, VRs, etc.), the hybrid thermal management system may employ a second section (e.g., cooling plate or the like) to dissipate heat generated by these second computing components. In doing so, the embodiments of the present disclosure provide heat dissipation capabilities that are computing component specific without excess cost or complexity. Furthermore, and as described hereafter, the embodiments of the present disclosure (1) negate the traditional requirements for thermal interface materials (TIMs) on high power computing components (e.g., CPUs, GPUs, etc.), (2) negate the traditional challenges associated with maintaining appropriate TIM bond line thickness with the curvature associated with large GPU implementations, and (3) reduce the thermal interfacial resistance associated with air-cooled heatsinks, vapor, liquid-cooled cold plates, and/or the like.

Hybrid Thermal Management Systems

With reference to FIG. 1, an example computing module 100 of the present disclosure is illustrated. As shown, the computing module 100 may include a substrate 102 that may support various computing components (e.g., optical components, electrical components, etc.) as described herein. In some embodiments, the substrate 102 may refer to a printed circuit board (PCB) that is configured to at least partially provide physically support to and electrical connectivity between the computing components described herein. As such, the substrate 102 may define or more electrical traces, wires, etc. configured to establish electrical communication between the computing components, electrical components, optical components, etc. described herein. Although illustrated herein as a generally planar substrate 102, the present disclosure contemplates that the dimensions (e.g., size and/or shape) of the substrate 102 may vary based on the intended application of the computing module 100 and may, in some embodiments, refer to a plurality of substrates that are, for example, attached so as to collectively support the components described herein.

With continued reference to FIG. 1, the substrate 102 may support a first computing component 104 having a first operating temperature and one or more second computing components 106 having a second operating temperature. As described herein, the first operating temperature may be greater than the second operating temperature such that the computing module 100 may include computing components having different thermal burdens. As shown, the first computing component 104 may be located proximate the one or more second computing components 106 on the substrate 102. By way of a non-limiting example, the one or more second computing components 106 may be located proximate the first computing component 104 (e.g. disposed on a first side of the first computing component 104). Although illustrated and described herein with reference to computing components 104, 106 that are located proximate to one another, the present disclosure contemplates that the hybrid thermal management techniques described herein may be applicable to computing components at any relative position, orientation, etc. on the substrate 102.

In some embodiments, the substrate 102 may further include one or more third computing components 108 that may further be located proximate the first computing component 104. By way of an additional, non-limiting example, the one or more third computing components may be positioned proximate a second side of the first computing component 104 that is opposite the first side of the first computing component 104 at which the one or more second computing components 106 are located. The operating temperature of the one or more third computing components 108 may also be less than the operating temperature of the first computing component 104. In some embodiments, the one or more third computing components 108 may be the same type of computing component as the one or more second computing components 106. In other embodiments, the one or more third computing components 108 may be a different type of computing components as the one or more second computing components 106. Although described herein with reference to a first computing component 104, one or more second computing components 106, and/or one or more third computing components 108, the present disclosure contemplates that the substrate 102 may support any number of computing components having associated operating temperatures based upon the intended application of the computing module 100.

By way of a particular example used hereinafter, the first computing component 104 may be a graphics processing unit (GPU) having a relatively high power density and, as such, a relatively higher operating temperature than other computing components of the optical module 100. Although described herein with reference to a GPU as the first computing component, the present disclosure contemplates that the first computing component 104 may refer to a plurality of GPUs leveraged by the optical module 100. The plurality of GPUs (e.g., the first computing component 104) may be associated with a die that, as described hereafter, forms at least a portion of the first section of a cooling delivery device. Although described herein with reference to a GPU, the present disclosure contemplates that the first computing component may be any computing component having a relatively higher power density (e.g., CPUs, data processing units (DPUs), etc.) By way of a particular example used hereinafter, the second computing components 106 and/or the third computing components 108 may be high-bandwidth memories (HBMs). As would be evident to one of ordinary skill in the art in light of the present disclosure, the operating temperature associated with the GPU (e.g., first computing component 104) may be greater than the operating temperature associated with the HBM (e.g., second and/or third computing components 106, 108). Although described herein with reference to an example HBM, the present disclosure contemplates that the second and/or third computing components 106, 108 may be any computing component (e.g., VRs or the like) supported by the substrate 100 having a power density that is relatively lower than the first computing component 104. Said differently, the hybrid thermal management systems described herein may be applicable to computing components of any type, number, configuration, etc. where a power density differential and resultant temperature differentiation amongst computing components exists. In other words, the structures and techniques described herein may be applicable to any processing unit or device, such as CPUs, switches, network adapters, DPUs, network elements, and/or the like without limitation.

In order to dissipate the heat generated by these computing components, the computing module 100 may further include a hybrid thermal management system 200 as illustrated in FIGS. 2-5. As shown, the hybrid thermal management system 200 may refer to the collection of components operably coupled with the computing components 104, 106, 108 and configured to circulate a cooling fluid for dissipating the heat generated by these computing components 104, 106, 108. The embodiments of the present disclosure may be described hereinafter with reference to a cooling liquid (e.g., water, refrigerant, etc.); however, the present disclosure contemplates that any fluid (e.g., air or the like) may be used by the hybrid thermal management system 100 so long as a temperature differential exists between the cooling fluid and the computing components 104, 106, 108 (e.g., the temperature of the cooling fluid is less than the operating temperature of the computing components 104, 106, 108).

The thermal management system 200 may include a cooling delivery device 201 that includes a first section 202 configured to dissipate heat generated by the first computing component 104 and a second section 204 configured to dissipate heat generated by the second computing component 106. The first section 202 may refer to the portion of the cooling delivery device 201 that houses cooling fluid used for dissipating heat generated by the first computing component 104 and may define any structure (e.g., channel, conduit, pipe, and/or the like) through which fluid may flow or by which convective cooling may occur. Therefore, as would be evident by the heat dissipation provided by the cooling delivery device 201, the first section 202 may be thermally coupled with the first computing component 104.

The second section 204 may refer to the portion of the cooling delivery device 201 that houses cooling fluid used for dissipating heat generated by the second computing component 106 and may similarly define any structure (e.g., channel, conduit, pipe, and/or the like) through which fluid may flow or by which convective cooling may occur. Therefore, as would be evident by the heat dissipation provided by the cooling delivery device 201, the second section 204 may be thermally coupled with the second computing component 106. In embodiments in which the computing module 100 includes third computing components 108, the cooling delivery device 201 may include a third section 206 that refers to the portion of the cooling delivery device 201 that houses cooling fluid used for dissipating heat generated by the third computing component 108 and may similarly define any structure (e.g., channel, conduit, pipe, and/or the like) through which fluid may flow or by which convective cooling may occur. Similarly, the third section 206 may be thermally coupled with the third computing component 108.

As illustrated and described hereafter with reference to FIGS. 2-5, the first section 202 and the second section 204 of the cooling delivery device 201 may be in fluid communication such that, for example, cooling fluid exiting the first section 202 is received by the second section 204 and, in some embodiments, is also received by the third section 206. As shown, the second section 204 may be downstream of the first section 202 such that the cooling fluid received by the cooling delivery device 201 is directed from the first section 202 of the cooling delivery device 201 to the second section 204 of the cooling delivery device 201. As would be evident to one of ordinary skill in the art in light of the present disclosure, however, the first section 202 of the cooling delivery device 201 may be fluidically isolated from the second section 204 in some embodiments. By way of example, in such an embodiment, the first section 202 may be formed as a first channel, conduit, or the like that circulates cooling fluid to the first computing component 104 alone. Similarly, in such an embodiment, the second section 204 may be formed as a second channel, conduit, or the like that circulates cooling fluid to the second computing component 106 alone.

With continued reference to FIGS. 2-5, the first section 202 may be in fluid communication with a cooling fluid source 300 configured to provide the cooling fluid to the cooling delivery device 201. The cooling fluid source 300 may refer to any reservoir, supply, repository, storage location, container, etc. that may provide and/or at least partially store cooling fluid. The cooling fluid source 300 may be associated with one or more structures (not shown) configured to provide fluid communication between the cooling fluid source 300 and the first section 202 of the cooling delivery device 201. By way of a non-limiting example, the cooling fluid source 300 may be associated with one or more conduits, channels, pipes, etc. through which fluid my flow. Furthermore, the cooling fluid source 300 may be associated with one or more mechanisms (e.g., pumps and/or the like) for causing movement of the cooling fluid from the cooling fluid source 300 to the first section 202. Although illustrated as a single cooling fluid source 300, the present disclosure contemplates that any number of cooling fluid sources may be in fluid communication with the hybrid thermal management system 200 of the present disclosure based on the intended application of the computing module 100, the operating characteristics of the computing module 100 and/or the like.

Figure 2:
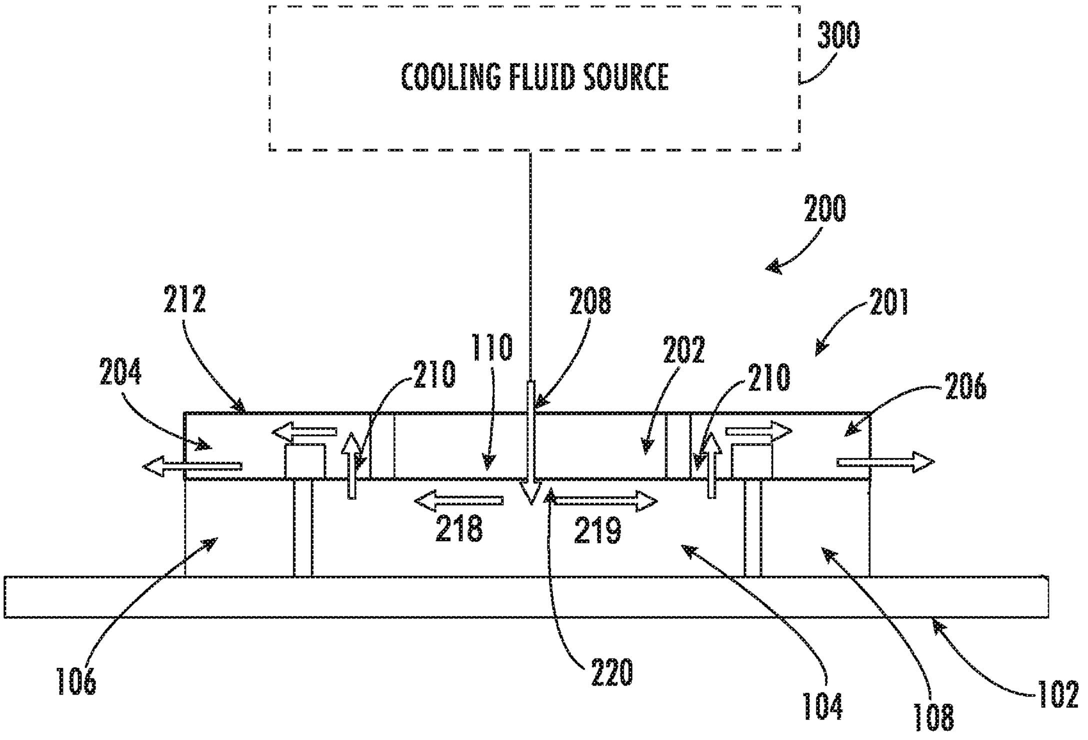
FIG. 2 illustrates a cross-sectional view of the computing module of FIG. 1 with an example hybrid thermal management system in accordance with some embodiments described herein.
Figure 3:
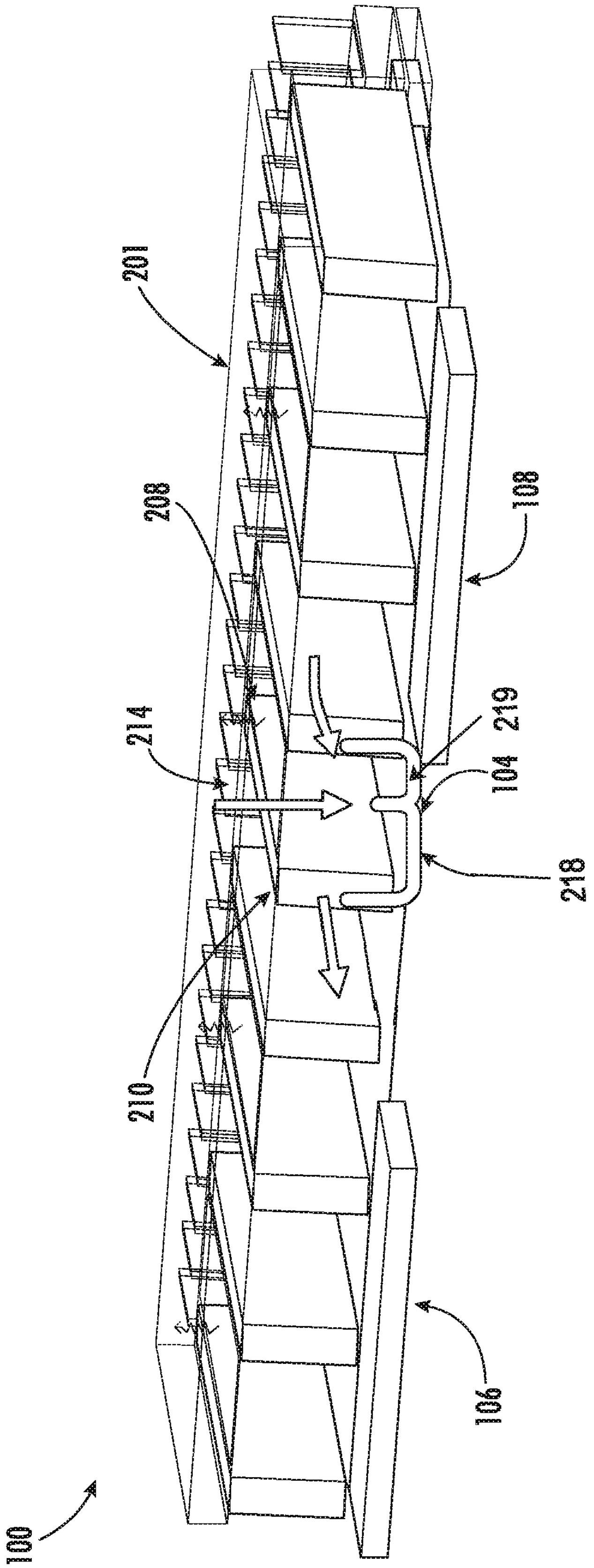
FIG. 3 illustrates a cross-sectional view of the example computing modules and hybrid thermal management system of FIGS. 1-2 with associated fluid flow directions in accordance with some embodiments described herein.
Figure 4:
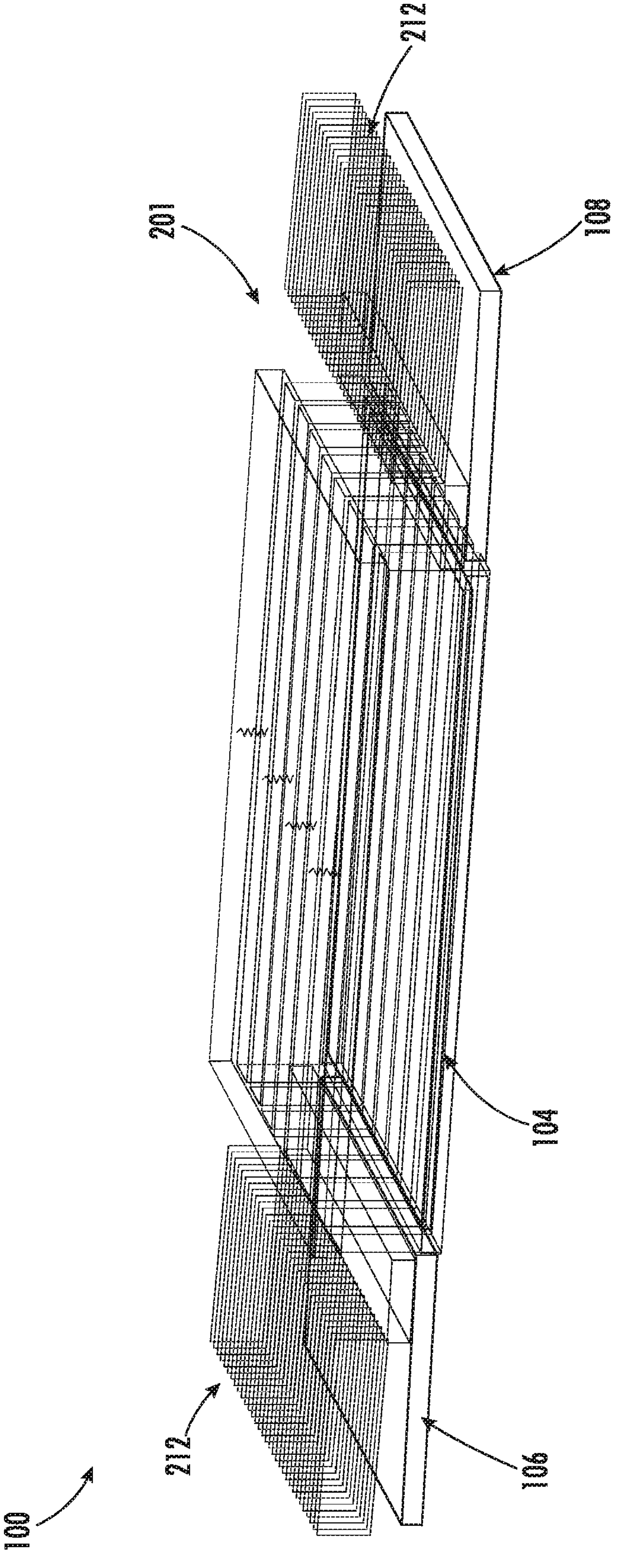
FIG. 4 illustrates an example computing module and hybrid thermal management system with example cold plates in accordance with some embodiments described herein.

As shown in FIGS. 2-3, the first section 202 of the cooling delivery device 201 may further include an inlet manifold 208 that is configured to receive the cooling fluid. By way of example, the inlet manifold 208 may refer to the structure that is in fluid communication with one or more conduits, channels, pipes, etc. associated with the cooling fluid source 300. The cooling fluid source 300 may, via a pump or the like, cause cooling fluid to be directed from the cooling fluid source 300 to the inlet manifold 208 via one or more cooling fluid conduits. Although described herein with reference to an inlet manifold 208, the present disclosure contemplates that the first section 202 of the cooling delivery device 201 may define any structure, inlet, opening, etc. configured to receive a cooling fluid.

As described above, the second computing component 106 and the third computing component 108 may be disposed proximate the first computing component 104. For example, the second computing component 106 may be disposed on a first side of the first computing component 104, and the third computing component 108 may be disposed on a second side of the first computing component 104 opposite the first side. The second section 204 and the third section 206 may similarly be disposed, for example, on opposing sides of the first section 202 such that the cooing fluid within the first section 202 is directed to the second section 204 and/or the third section 206. The first section 202 of the cooling delivery device 201 may further include exhaust manifold(s) 210 that operates to direct the cooling fluid from the first section 202 of the cooling delivery device 201 to the second section 204 and/or the third section 208 of the cooling delivery device 201. Similar to the inlet manifold 208, the exhaust manifold(s) 210 may refer to the structure that provides fluid communication between the first section 202 and the second and/or third sections 204, 206. In some embodiments, the first section 202, the second section 204, and/or the third section 206 may be formed as an integral structure such that the exhaust manifold(s) 210 refer to the portion of the cooling delivery device 201 where the first section 202 transitions to the second section 204 and/or the third section 206. In other embodiments, such as when the cooling delivery device 201 is formed of a plurality of attachable portions (e.g., a modular assembly or the like), the exhaust manifold(s) 210 and/or the inlet manifold 208 may be distinct components.

In some embodiments, as illustrated by the cooling fluid flow in FIGS. 2-3, in operation, the cooling fluid may be supplied to the first section 202 via the inlet manifold 208 in a first direction 214. This first direction 214 may, for example, be substantially perpendicular with respect to the substrate 102 and/or the first computing component 104. In this way, the cooling fluid received by the cooling delivery device 201 impinges upon the first section 202 of the cooling delivery device 201 and is directed laterally outward along a surface 220 of the first section 202. The impingement upon the first section 202 may be such that the cooling fluid is received by a surface 220 of a die of the first computing component 104 such that, in some embodiments, the cooling fluid is at least partially disposed within microfluidic channels (e.g., microfluidic channels 502 in FIGS. 5-6B) etched into the die.

Upon contact or impingement with the first section 202, the cooling fluid may be redirected into a second direction 218 that is substantially perpendicular with respect to the first direction 214. For example, the cooling fluid may impinge upon the first section (e.g., the surface 220 of the die forming the GPU) and move laterally across the first section in the direction of the second computing component 106. Although not illustrated in FIGS. 2-3, the cooling fluid may be similarly directed towards the third computing component 108. Thereafter, the first section 202 of the cooling delivery device 201 may be further configured to redirect the cooling fluid to a third direction 219 opposite the first direction 214 towards the second section 204 of the cooling delivery device 201. The third direction 219 may be towards the example exhaust manifold 210 indicative of the interface between the first section 202 and the second section 204.

Although described and illustrated herein with reference to a redirection of cooling fluid between sections 202, 204, and 206, the present disclosure contemplates that the particular orientation, configuration, etc. of the cooling delivery device 201 may vary based upon the intended application of the computing module 100.

As would be evident in light of the electrical nature of the computing components 104, 106, 108 described herein, the hybrid thermal management system 200 may operate to prevent the interaction between the cooling fluid and the computing components. In some embodiments, for example, the hybrid thermal management system 200 and associated cooling delivery device 201 may be formed as an integral and/or rigid body. In such an embodiment, the integral body may be watertight so as to prevent the incursion of cooling fluid into the computing components. In some embodiments, one or more sections of the cooling delivery device 201 may move independently and, therefore, may leverage flexible tubing, sliding seals, and/or the like to prevent interaction between the cooling fluid and the computing components. Such an implementation may further allow for the accommodation of the different dimensions between computing components, such as in instances in which the first computing component 104 (e.g., a GPU) and the second computing component 106 (e.g., an HBM) have differing heights.

Figure 6A:
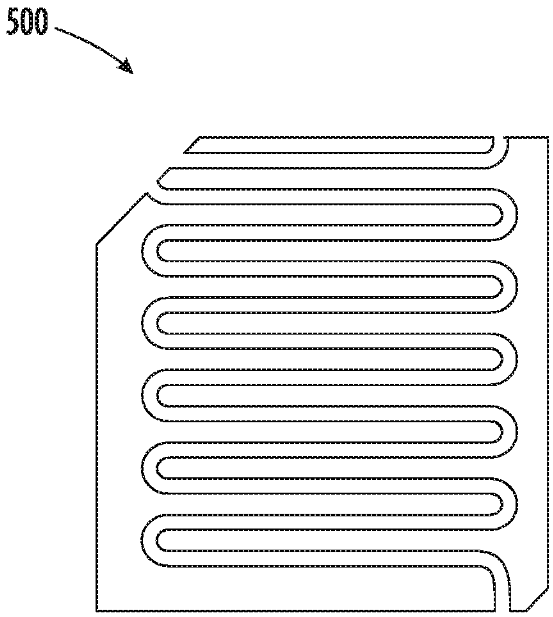
FIGS. 6A-6B illustrate example etched microfluidic channels for dissipating heat associated with example computing components in accordance with some example embodiments described herein.
Figure 6B:
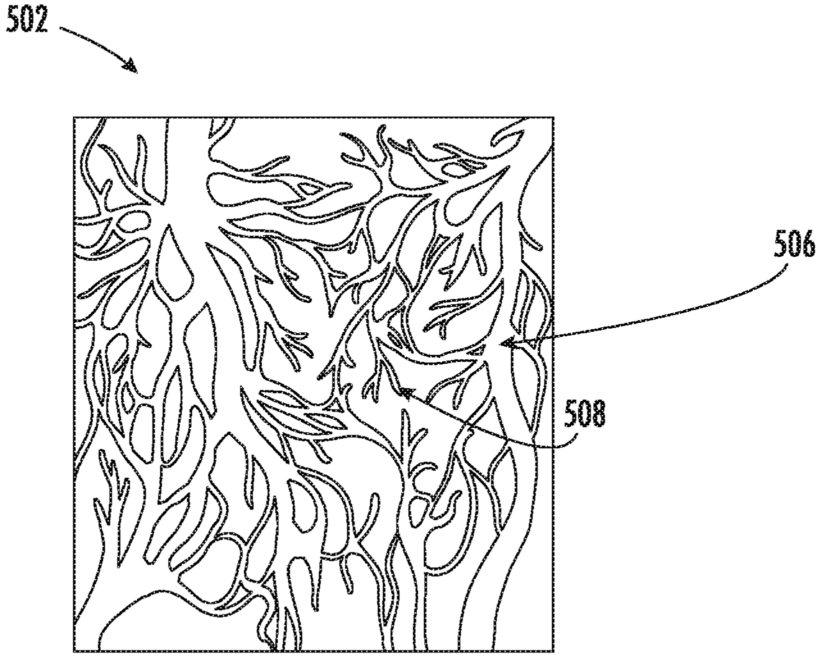

In order to provide variable heat dissipation that is computing component specific, the hybrid thermal management system 200 may include different types of cooling implementations between the sections 202, 204, 206 of the cooling delivery device 201. Given that the first operating temperature of the first computing component 104 is greater than the second operating temperature of the second computing component 106, the first section 202 may define microfluidic channels as illustrated in FIGS. 6A-6B that provide improved heat dissipation relative conventional techniques. By way of a particular example, the first section 202 of the cooling delivery device 201 may further define one or more microfluidic channels that at least partially support (e.g., alone or in conjunction with one or more other components/structures) the cooling fluid therein. The cooling fluid received from the cooling fluid source 300 may fill an example network of one or more microfluidic channels that are etched into a surface 220 of a die of the first computing component 104 as described hereafter with reference to FIGS. 6A-6B. By way of continued example, an inlet temperature of the cooling fluid when received by the first section 202 of the cooling delivery device 201 may be less than the first operating temperature of the first computing component 104. In this way, the temperature differential between the cooling fluid and the first computing component 104 may cause heat to be transferred from the first computing component 104 (e.g., a GPU) to the cooling fluid so as to reduce the first operating temperature of the first computing component 104.

Given that the power density and associated thermal burden of the second and third computing components 106, 108 is relatively lower than the first computing component 104, the second and third sections 204, 206 of the cooling delivery device 201 may employ a second type of cooling mechanism or technique that dissipates heat at a rate or effectiveness that is less than the heat dissipation provided by the first section 202. By way of example, the second section of the cooling delivery device may further define a cooling plate 212 that may, for example, substantially seal one or more of the computing components 104, 106, 108 from incursion of the cooling liquid within the cooling delivery device 201. The cooling plate 212 may refer to a structure (e.g., formed of copper or otherwise) that is maintained at a temperature that is less than the temperature of the cooling fluid that contacts the cooling plate 212.

As the cooling fluid moves through the second and third sections 204, 206 of the cooling delivery device 201, the cooling fluid may have a lower temperature than the second operating temperature of the example second computing component 106. The cooling fluid may also have a temperature (alone or as influenced by the second operating temperature) that is greater than the temperature of the cooling plate 212. The cooling fluid may contact the cooling plate 212 that has a relatively lower temperature, and heat from the cooling fluid may be dissipated to the cooling plate due to this temperature differential. Although described herein with reference to example cooling plates 212, the present disclosure contemplates that the second and third sections 204, 206 may include any mechanism for dissipating heat from the cooling fluid within these sections based upon intended application of the computing module 100, the type of computing component 106, 108, and/or the like.

In instances in which the first section 202 and the second and third sections 204, 206 are fluidically isolated as described above, the cooling fluid that is within the first section 202 may be less than the first operating temperature of the first computing component 104 without consideration of the second operating temperature of the second computing component 106 or the third operating temperature of third computing component 108. In such an example embodiment, the temperature of the cooling the cooling fluid that is within the second section 204 and/or the third section 206 may be less than the respective second and third operating temperatures of the second and third computing components 106, 108 without consideration of the first operating temperature of the first computing component 104.

In an example embodiment in which the second and third sections 204, 206 are downstream of the first section 202, the temperature of the cooling fluid within the cooling delivery device 201 may account for the operating temperatures of particular computing components 104, 106, 108. For example, an inlet temperature of the cooling fluid when received by the first section 202 of the cooling delivery device 201 may be less than the first operating temperature of the first computing component 104. An exhaust temperature of the cooling fluid entering the second/third section 204, 206 of the cooling delivery device 201, however, may be greater than the inlet temperature of the cooling fluid but less than the second operating temperature and third operating temperature of the respective second and third computing components 106, 108. The present disclosure contemplates that the hybrid thermal management system 200 may include various sensors (not shown) configured to determine the various operating temperatures, inlet temperature, exhaust temperatures, and/or the like so as to ensure effective heat dissipation for the associated computing components.

Figure 5:
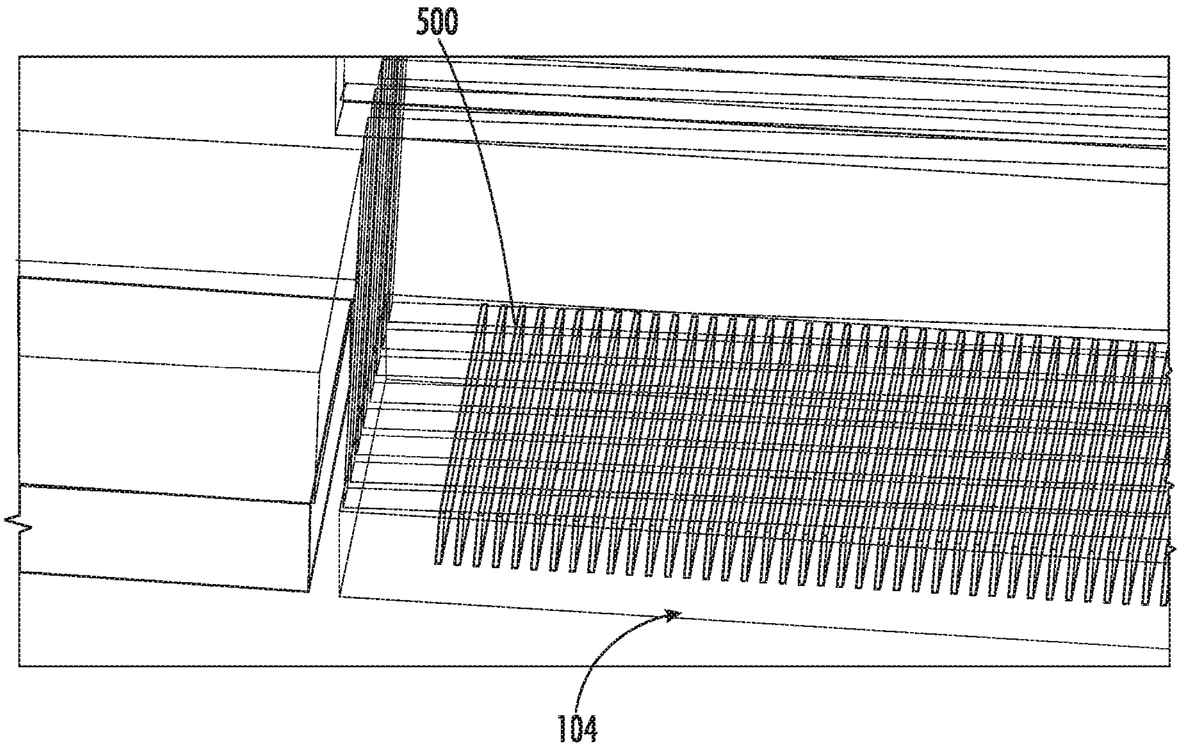
FIG. 5 illustrates microfluidic channels for dissipating heat associated with example computing components in accordance with some example embodiments described herein.
Figure 7:
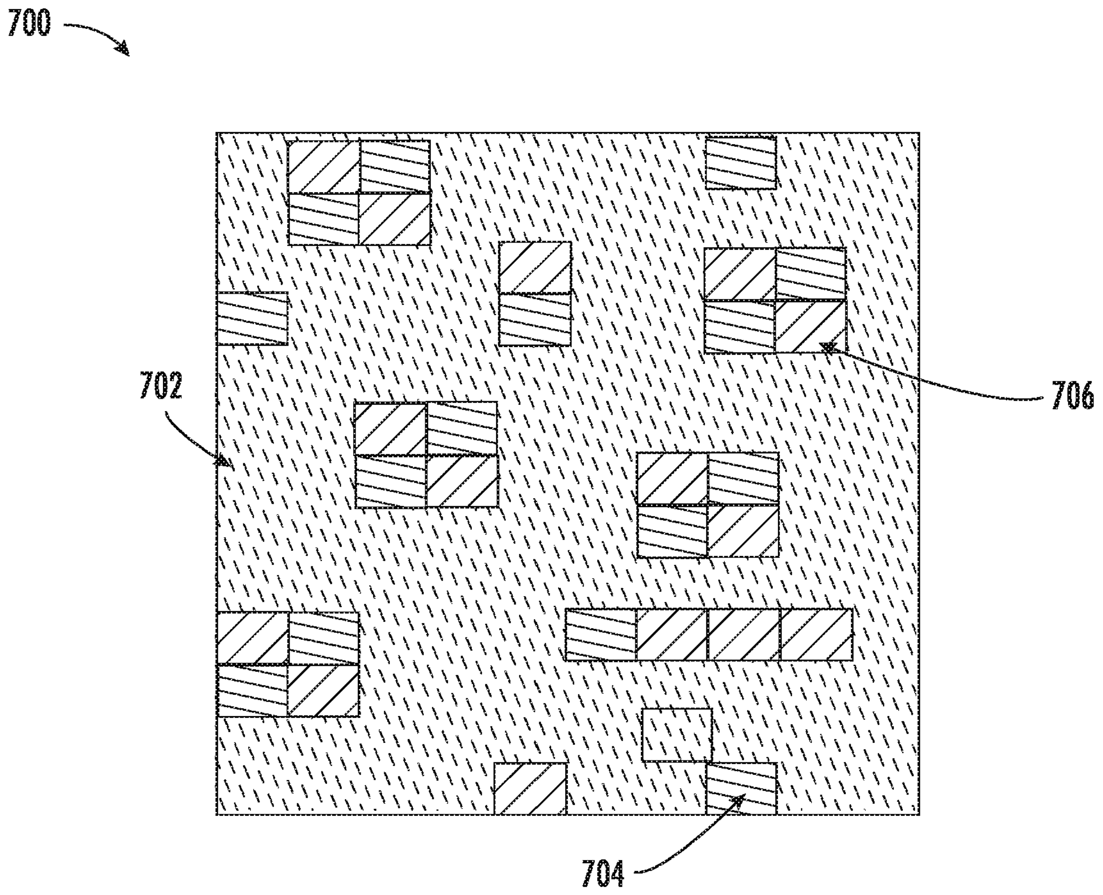
FIG. 7 illustrates an example power map associated with the computing modules described herein.

As shown in FIGS. 5-6A, the first computing component 104 may include microfluidic channels 500 that are etched into a surface. The microfluidic channels 500 illustrate an example for a generic application of the techniques described herein without particular consideration of the variability in temperature associated with the different computing components of the computing module 100. With reference to FIG. 6B, in some embodiments, the first section 202 may define complex networks of microfluidic channels 502 that may account for the variability in thermal burden for the various computing components described herein. For example, a portion 506 of the network of microfluidic channels 502 may be designed as a large distribution channel that reduces pressure drop experienced by the network 502. In some embodiments, a portion 508 may be designed with a plurality of narrow cooling channels that increases the heat transfer between the cooling fluid and the computing components 104, 106, 108. In this way, the network of microfluidic channels 502 may be designed to maximize the heat transfer of particular locations of increased heat, such as illustrated in FIG. 7. With reference to FIG. 7, an example power map 700 associated with the computing module 100 is illustrated. As shown, the computing module 100 may include areas of low power (e.g., lower temperature) 702, areas of high power (e.g., higher temperature) 706, and/or areas of medium temperature (e.g., greater than areas 702 but lower than areas 706) 704.

Although described herein with reference to a cooling delivery device 201 of the hybrid thermal management system 200 configured to dissipate heat, the present disclosure contemplates that the components of the hybrid thermal management system 200 may be equally applicable to heating implementations. For example, in some instances, such a hybrid thermal management system 200 may be configured to heat the first computing component(s) 104 and/or the second component(s) 106 (e.g., a heating delivery device as opposed to a cooling delivery device). In such an embodiment, the inlet temperature of the cooling fluid when received by the first section 202 of the cooling delivery device may be greater than the first operating temperature of the first computing component 104 (e.g., so as to increase the temperature of the first computing component 104). In some further heating-based embodiments, an exhaust temperature of the cooling fluid entering the second section 204 of the cooling delivery device 201 may be less than the inlet temperature of the cooling fluid but greater than the second operating temperature of the second computing component 106 (e.g. so as to increase the temperature of the second computing component(s) 106).

Many modifications and other embodiments of the present disclosure set forth herein will come to mind to one skilled in the art to which these embodiments pertain having the benefit of the teachings presented in the foregoing descriptions and the associated drawings. Although the figures only show certain components of the methods and systems described herein, it is understood that various other components may also be part of any optical component or optoelectronic element. In addition, the methods described above may include fewer steps in some cases, while in other cases may include additional steps. Modifications to the steps of the method described above, in some cases, may be performed in any order and in any combination.

Therefore, it is to be understood that the disclosure is not to be limited to the specific embodiments disclosed herein and that modifications and other embodiments are intended to be included within the scope of the appended claims. Although specific terms are employed herein, they are used in a generic and descriptive sense only and not for purposes of limitation.

That which is claimed:

1. A computing module comprising:

a first computing component having a first operating temperature;

a second computing component having a second operating temperature, wherein the first operating temperature is greater than the second operating temperature; and a hybrid thermal management system comprising:

a cooling delivery device configured to receive a cooling fluid, the cooling delivery device defining:

a first section configured to dissipate heat generated by the first computing component; and a second section configured to dissipate heat generated by the second computing component, wherein the first section comprises one or more microfluidic channels formed into a surface of a die of the first computing component, the one or more microfluidic channels comprising a distribution channel configured to reduce a pressure drop and a cooling channel configured to increase a heat transfer from the first computing component; and the second section comprises a cold plate fluidically coupled to an exhaust of the first section.

2. The computing module according to claim 1, wherein the first section of the cooling delivery device is fluidically isolated from the second section of the cooling delivery device.

3. The computing module according to claim 1, wherein the second section is in fluid communication with the first section.

4. The computing module according to claim 3, wherein the cooling fluid received by the cooling delivery device is directed from the first section of the cooling delivery device to the second section of the cooling delivery device.

5. The computing module according to claim 3, wherein an inlet temperature of the cooling fluid when received by the first section of the cooling delivery device is less than the first operating temperature of the first computing component.

6. The computing module according to claim 5, wherein an exhaust temperature of the cooling fluid entering the second section of the cooling delivery device is greater than the inlet temperature of the cooling fluid but less than the second operating temperature of the second computing component.

7. The computing module according to claim 3, wherein the first section of the cooling delivery device further comprises an inlet manifold configured to receive the cooling fluid.

8. The computing module according to claim 7, wherein the inlet manifold is in fluid communication with a cooling fluid source.

9. The computing module according to claim 7, wherein the first section of the cooling delivery device further comprises an exhaust manifold configured to direct the cooling fluid from the first section of the cooling delivery device to the second section of the cooling delivery device.

10. The computing module according to claim 3, wherein, in operation, the first section of the cooling delivery device is configured to receive the cooling fluid in a first direction and redirect the cooling fluid to a second direction that is substantially perpendicular with respect to the first direction.

11. The computing module according to claim 10, wherein the first section of the cooling delivery device is further configured to redirect the cooling fluid to a third direction opposite the first direction towards the second section of the cooling delivery device.

12. The computing module according to claim 3, wherein, in operation, the cooling fluid received by the cooling delivery device impinges upon the first section of the cooling delivery device and is directed laterally outward along a surface of the first section.

13. The computing module according to claim 3, wherein the second computing component is positioned proximate a first side of the first computing component.

14. The computing module according to claim 13, further comprising a third computing component disposed on a second side of the first computing component, the cooling delivery device further comprising a third section in fluid communication with the first section and configured to dissipate heat generated by the third computing component.

15. The computing module according to claim 1, wherein the cold plate is configured to substantially seal the first computing component from incursion of the cooling fluid within the cooling delivery device.

16. The computing module according to claim 1, wherein the first computing component is a graphics processing unit (GPU) and the second computing component is a high-bandwidth memory (HBM) device.

17. The computing module according to claim 1, wherein the cooling fluid is configured to flow laterally through the one or more microfluidic channels to form the exhaust.

18. The computing module according to claim 1, wherein the cold plate is configured to dissipate heat at a rate of effectiveness that is less than the heat dissipation provided by the one or more microfluidic channels.

19. The computing module according to claim 1, wherein the cooling channel is narrower than the distribution channel.

20. The computing module according to claim 1, wherein the first computing component comprises one or more locations of increased heat and the one or more microfluidic channels are configured to increase heat transfer at the one or more locations of increased heat compared to other locations of the first computing component.

* * * * *